United States Patent [19]
Frentzel et al.

[11] Patent Number: 5,395,876
[45] Date of Patent: Mar. 7, 1995

[54] SURFACE MOUNT CONDUCTIVE ADHESIVES

[75] Inventors: Richard L. Frentzel, Chino Hills; Scott Allen, Baldwin Park, both of Calif.

[73] Assignee: Acheson Industries, Inc., Port Huron, Mich.

[21] Appl. No.: 47,518

[22] Filed: Apr. 19, 1993

[51] Int. Cl.6 .......................... C08K 3/08; H01B 1/02
[52] U.S. Cl. .................................. 524/440; 252/514; 428/901; 156/327
[58] Field of Search .................. 524/440; 252/514; 428/901; 156/327

[56] References Cited

U.S. PATENT DOCUMENTS

| | | | |
|---|---|---|---|
| 4,518,524 | 5/1985 | Stoetzer | 524/440 |
| 4,740,532 | 4/1988 | May, Jr. et al. | 522/34 |
| 5,043,102 | 8/1991 | Chen et al. | 252/514 |

FOREIGN PATENT DOCUMENTS

| | | |
|---|---|---|
| 61-062558 | 3/1986 | Japan . |
| 62-177074 | 8/1987 | Japan . |
| 2202959 | 8/1990 | Japan . |
| 2111072 | 6/1983 | United Kingdom . |

OTHER PUBLICATIONS

Nguyen et al., "Conductive Adhesives" Circuits Assembly, Jan. 1993, pp. 36–38 and 41.

*Primary Examiner*—Tae H. Yoon
*Attorney, Agent, or Firm*—Dinnin & Dunn

[57] ABSTRACT

A surface mount conductive adhesive composition comprising:
(a) about 2 to about 15 parts by weight of a binder resin selected from the group consisting of acrylated urethane resin, acrylic resin, and mixtures thereof;
(b) about 2 to about 15 parts by weight of an acrylate monomer;
(c) about 0.01 to about 3 parts by weight of a free radical initiator; and
(d) about 72 to about 95 parts by weight of finely divided silver particles.

16 Claims, No Drawings

5,395,876

SURFACE MOUNT CONDUCTIVE ADHESIVES

BACKGROUND OF THE INVENTION

1. Field of the Invention

The present invention is directed to surface mount conductive adhesive composition. In particular, the present invention relates to particular mixtures of finely divided silver particles, an acrylated urethane resin or an acrylic resin, an acrylate monomer, and free radical initiator useful as surface mount conductive adhesive compositions for bonding electrical components onto flexible circuitry such as membrane switches.

2. Description of Related Art Including Information Disclosed Under 37 CFR §'s 1.97 and 1.98

Existing commercially available surface mount conductive adhesives are typically made from mixtures of epoxy resins, epoxy curatives, solvent and silver. When cured, these materials tend to be very brittle or exhibit a high modulus of elasticity. For printed wiring board (PWB) applications, since the substrate is rigid, such high modulus adhesives produce acceptable bonding between the electrical component and the substrate. However, for flexible circuits such as membrane switches, high modulus surface mount conductive adhesives may not be suitable because of cracking and loss of adhesion during flexing.

It has also been observed that epoxy based adhesives show poor compatibility with polymer thick film substrates based on vinyl resins in that during the curing step, the epoxy system reacts with the resin resulting in severe discoloration and loss in adhesion.

G. P. Nguyen, J. R. Williams, and Fredrick W. Gibson, "Conductive Adhesives", Circuits Assembly January 1993, pages 36-38 and 41 discuss the general expected properties of surface mount conductive adhesives for several applications.

SUMMARY OF THE INVENTION

Accordingly, one aspect of the present invention is directed to a surface mount conductive adhesive comprising:

(a) about 2 to about 15 parts by weight of a binder resin selected from the group consisting of acrylated urethane resins, acrylic resin, and mixtures thereof;

(b) about 2 to about 15 parts by weight of an acrylate monomer;

(c) about 0.01 to about 3 parts by weight of a free radical initiator; and (d) about 72 to about 95 parts by weight of finely divided silver particles.

Another aspect of the present invention is directed to an electrical component surface mounted onto a substrate by the above-noted conductive adhesive composition.

DESCRIPTION OF THE PREFERRED EMBODIMENTS

AS stated above, the uncured conductive adhesive composition employed in the process of the present invention has four critical components: at least one selected binder resin; at least one acrylate monomer; at least one free radical initiator; and finely divided silver particles.

The first critical component of the present invention is a binder resin selected from the group consisting of an acrylated urethane resin, an acrylic resin, and mixtures thereof. The preferred acrylated urethane resin is Echo Resin ALU-350 acrylated aliphatic urethane oligomer available from Echo Resins and Laboratory of Versailles, Mo. The preferred acrylic resin is ACRYLOID B-72 acrylic resin available from Rohm & Haas of Philadelphia, Pa.

The preferred amount of the binder resin is about 2 to about 12 parts by weight in the curable adhesive compositions.

The second critical component of the present invention is an acrylate monomer. Generally, acrylate monomers are made by processes which do not introduce ionic impurities into the monomers. Furthermore, acrylate monomers generally polymerize quickly and are believed to produce a more flexible cured adhesive composition which leads to less stress on an electrical component attached to a flexible substrate. Suitable acrylate monomers include methyl methacrylate, ethyl methacrylate, methyl acrylate, ethyl acrylate, butyl methacrylate, cyclohexyl methacrylate, hexyl methacrylate, 2-ethylhexyl acrylate, lauryl acrylate, methacrylate acid, acrylic acid glycidyl methacrylate, isoborny methacrylate, ethylene glycol, higher glycol acrylates, and methacrylate and hexamethylene diacrylate. Diacrylates are the preferred acrylate monomers. The most preferred acrylate monomers are 1,6-hexanediol diacrylate and tripropylene glycol diacrylate.

The preferred amount of acrylate monomer is from about 3 to about 13 parts by weight of the curable adhesive composition.

The third critical component of the curable conductive adhesive system is a free radical initiator. Free radical initiators (or free radical generators) are well known to those skilled in the art and are described, for example, in "Free Radical in Solution, C. Welling, J. Wiley & Sons, New York, 1957 and in "The Chemistry of Organic Film Foamers" D. H. Solomon, J. Wiley & Sons, New York, 1967. The preferred classes of free radical initiators are organic peroxides and hydroperoxides. The preferred free radical initiators are t-butyl perbenzoate; 1,1-di(t-butyl peroxy) cyclohexane; and 2,5-dimethyl-2,5-bis(2-ethylhexanoyl peroxy). The free radical initiator is used to polymerize the acrylate monomer and resin oligomers.

The most preferred free radical initiator is 2,5-dimethyl-2,5-bis(2-ethylhexanoyl peroxy). This is available as USP-245 from Argus, Division of Witco Corporation of Marshall, Tex.

The preferred amount of free radical initiator is from about 0.1 to about 1 part by weight in the curable adhesive composition.

The fourth critical component is finely divided silver particles. The silver particles must be in a finely divided form suitable for intimate blending with the binder resin and the acrylate monomer.

The preferred finely divided silver particles preferably have an average particle diameter under 50 microns. Silver flakes, especially those containing low amounts of impurities (e.g., less than 100 ppm of $Cl^-$, $Na^+$, $K^+$, and $NH^{+4}$) are especially preferred because of their electroconductivity advantages. Such preferred high purity silver flakes are those commercially available from Metz Metallurgical Corporation of South Plainfield, N.J.; Handy & Harmon Inc. of Fairfield, Conn.; and Chemet Corporation of Attleboro, Mass.

Any silver flake commonly employed as conductive fillers may be suitable for the present adhesive composition. The preferred silver flake used will depend upon the particular binder resin and acrylate monomer employed as well as the specific application for which the adhesive composition will be used. The term "silver flake" means herein a silver powder whose predominant shape is flakes as determined by scanning electron microscopy. Such silver flakes typically have a surface area of approximately 0.8–1.40 meters $^2$/gram and over 99% by weight purity. These silver flakes generally have an average particle size of about 0.1 to about 10 microns.

The preferred amount of finely divided silver particles is about 75 to about 88 parts by weight added into the curable adhesive composition.

The curable adhesive composition of the present invention may preferably also contain other minor ingredients. Such optional ingredients include other conductive fillers, solvents, and theology modifiers.

Other optional conductive fillers include other metal powders and flakes, graphite and carbon black. If used, such other fillers may be preferably employed in amounts from 0.05 to 20 parts by weight in the total curable adhesive composition.

Optional solvents include nonhydrocarbon polar organic solvents such as carbitol, carbitol acetate, butyl carbitol, butyl carbitol acetate, butyrolactone, acetone, methylethyl ketone, cyclohexanone, dibasic ester solvent, diglyme, and high boiling alcohols and alcohol esters. Various combinations of these and other solvents are formulated to obtain the desired viscosity and volatility requirements for each application. For screen printing applications, the solvent or solvents chosen should preferably have a boiling point from about 150° C. to 240° C. The preferred optional solvent is butyrolactone.

The preferred amount of solvent is from about 20–40 parts by weight, most preferably from about 25–35 parts, added into the curable adhesive composition.

Optional rheology modifiers include organophilic clays and hydrophobic silica. A preferred organophilic clay is BENTONE SD-2 organophilic clay rheological additive available from NL Chemicals of Hightstown, N.J. A preferred hydrophobic silica is AEROSIL R202 hydrophobic silica available from DeGussa Corporation of Teterboro, N.J.

The components of the present conductive adhesive may be mixed together by any conventional means. Preferably, it is desirable to first mix the binder resin, acrylate monomer, and free radical initiator together in conventional mixing apparatus. Optional solvents and optional theology modifiers and the like may also be mixed in at that time. The silver flake may then be mixed in by any conventional means. The mixture (before or after the addition of the silver flake) may be preferably placed in a three-roll mill or another suitable milling machine to obtain a fineness of grind of the composition of under about 30 microns. The uncured conductive adhesive composition preferably has a viscosity from about 10,000 to about 700,000 centiposes at 25° C. and a surface resistivity of less than about 1 ohm-cm.

The adhesive compositions of this invention may be applied to substrates by a variety of techniques, such as screen printing, dot transferring, brushing, or syringe dispensing. Once the conductive adhesive composition has been applied to either the substrate or the electrical component or both, an electrical component and the substrate are then contacted together. Next, the conductive adhesive of present is dried and thermally cured by exposing it and the substrate to elevated temperatures one or more times. The preferred curing, in a convention oven, is at temperatures from about 100° C. to about 200° C. for about 30 seconds to 60 minutes. Any conventional conductive adhesive curing means and apparatus may be used.

The conductive adhesive compositions of the present invention may be applied to conventional rigid or flexible substrates. Whether the substrate is flexible or rigid in nature, the substrate may or may not have to be pretreated or precoated with any other substance before applying the present curable adhesive compositions.

The conductive compositions of the present invention are flexible and as such, they may be applied to a flexible substrate such as, for example, polyester films. Examples of flexible substrates that may be coated with the conductive compositions of the present invention are polyester substrates such as those made by E. I. DuPont de Nemours Co. and sold under the trademark MYLAR ®. Of course, other materials such as polycarbonate film or polyvinyl fluoride (PVF) film may be used as a substrate.

The term "flexible" as presently employed in this specification and claims is used to mean when the composition of the present invention may be subjected to deformative forces (e.g., twisting or bending) and will not release from the substrate or crack or break. The composition, in its deformed state, will function as well as the composition in its undeformed state. The most severe form of deformation would be to put a crease in the composition. This may be accomplished by a 180 degree angle fold of the composition and substrate. A flexible composition like those of the present invention will function well under this condition. If the composition cracks or breaks as the result of being distorted, the composition would not be considered flexible; cracks in the composition cause a severe decrease in conductivity and other electrical and mechanical properties.

The preferred substrates are those from which membrane touch switches are made. Phenolic paper PWB's are examples of rigid substrates.

The present invention is further described in detail by the following Examples. All parts and percentages are by weight and all temperatures are degrees Celsius, unless explicitly stated otherwise.

EXAMPLE 1

The following components were mixed together in a Cowles mixer for 5 minutes. That mixture was then passed once through a Niescht 3-roll mill.

| Component | Parts Per Hundred By Weight |
| --- | --- |
| Acrylated urethane resin(1) | 72.67 |
| 1,6-Hexanediol diacrylate(2) | 23.25 |
| Peroxide free-radical initiator(3) | 1.45 |
| Rheology modifier(4) | 1.88 |
| Crystalline silica(5) | 0.73 |
| | 99.98 |

(1)Echo Resin ALU-350 acrylated aliphatic urethane oligomer (CAS #82339-25-1) available from Echo Resins and Laboratory of Versailles, MO.
(2)1,6-Hexanediol Diacrylate (HDODA) acrylate ester monomer (CAS #013048-33-4) available from Radcure Specialties, Inc. of Louisville, KY.
(3)USP-245 2,5-dimethyl-2,5-bis(2-ethyl hexanoyl peroxy) hexane peroxide-type free radical initiator (CAS #13052-09-0) available from Argus Division of Witco Corp. of Marshall, TX.
(4)BENTONE SD-2 Organophilic clay rheological additive available from NL Chemicals of Hightstown, NJ.
(5)AEROSIL R202 hydrophobic silica (CAS #67762-90-7) available from DeGussa Corp. of Teterboro, NJ.

-continued

| 84 Grams of silver flake[6] was added to 16 grams of the above milled mixture. The resulting adhesive system was formed by mixing those ingredients in a Cowles mixer for 2 more minutes. The viscosity and electrical characteristics of this silver-based adhesive system were measured to be as followed: | |
|---|---|
| Viscosity: (Brookfield Cp51, 0.5 rpm 25° C.) | 676,000 cps |
| Electrical Resistivity[7]: | 0.06 ohm–cm |

[6]Silver flake No. 82 available from DeGussa Corp. of South Plainfield, NJ.
[7]Electrical resistivity was determined by drawing down the adhesive between two pieces of tape approximately 0.25 inches apart at a length of 2 inches. The cure schedule was 130° C./5 minutes.

A small pattern of this silver-based adhesive system was stencil printed onto a 1 square inch pattern of a vinyl-based silver polymer thick film (725A PTF available from Olin Hunt Conductive Materials of Ontario, Calif.) which was previously printed and cured on a ICI Melinex 505 polyester film. A small chip capacitor was placed on the adhesive and then entire assembly was cured for 130° C. for 6 minutes. The shear adhesive strengths on three samples were determined to be 1.3, 1.6, and 2.2 kilograms using an Anza Die Shear Tester (Model 560). No discoloration of the cured underlying 725A PTF material was observed. When flexed at a 90° angle, the adhesive showed no cracking and no loss in bond strength.

EXAMPLE 2

The following components were mixed together with a Cowles mixer for 5 minutes. That mixture was then milled in a 3-roll mill in one pass.

| Component | Parts per Hundred By Weight |
|---|---|
| Silver Flake[1] | 83.0 |
| Tripropylene glycol diacrylate[2] | 9.9 |
| Acrylic resin[3] | 6.6 |
| Peroxide free-radical initiator[4] | 0.5 |
| | 100.00 |

[1]Silver flake (CAS No. 7440-22-4) available from DeGussa Corp. of South Plainfield, NJ.
[2]Tripropylene glycol diacrylate (CAS No. 42978-66-5) available from Sartomer of Exton, PA.
[3]Acryloid B-72 acrylic resin (CAS No. proprietary) available from Rohm & Haas of Philadelphia, PA.
[4]USP-245 2,5-dimethyl-2,5-bis(2-ethyl hexanoyl peroxy) hexance peroxide-type free-radical initiator (CAS No. 13052-09-0) available from Argus, Division of Witco Corp. of Marshall, TX.

| The viscosity and electrical resistance characteristics of this silver-based adhesive system were measured to be as follows: | |
|---|---|
| Viscosity: (Brookfield CP51. 0.5 rpm 25° C.) | 315,000 cps |
| Electrical Resistivity[5]: | 0.00068 ohms–cm |

[5]Electrical resistivity was determined by drawing down the adhesive between two pieces of tape approximately 0.15 inches apart at a length of 2 inches. The cure schedule was 6 minutes at 130° C.

A small pattern of this silver-based adhesive system was stencil printed onto a 1 square inch pattern of vinyl-based silver polymer thick film (725A PTF available from Olin Hunt Conductor Materials of Ontario, Calif.) which was previously printed and cured on polyester film. A 100 square mil semiconductor die was placed on the adhesive and then cured for 6 minutes at 130° C. The shear adhesive strengths on five samples were determined to be 4.4, 4.3, 5.8, 6.1, and 5.0 kilograms using an Anza Die Shear Tester (Model 560). Five additional samples prepared as above were placed in 100° F. water for 6 hours and then placed in a humidity chamber for 16 hours at 65° C. and 65% relative humidity. The shear adhesive strengths of these five additional samples were determined to be 3.7, 4.0, 5.9, 5.8, and 5.0 kilograms. The average shear strength for the five samples not subjected to the humidity testing was 5.1. The average shear strength for the five different samples subjected to the humidity testing was 4.9. These average values indicate that this surface mount adhesive composition does not seriously degrade when subject to extreme humidity and heat exposure.

While the invention has been described above with reference to specific embodiments thereof, it is apparent that many changes, modifications, and variations can be made without departing from the inventive concept disclosed herein. Accordingly, it is intended to embrace all such changes, modifications, and 10 variations that fall within the spirit and broad scope of the appended claims. All patent applications, patents, and other publications cited herein are incorporated by reference in their entirety.

what is claimed is:

1. A surface mount conductive adhesive composition comprising:
   (a) about 2 to about 15 parts by weight of a binder resin selected from the group consisting of acrylated urethane resin, acrylic resin, and mixtures thereof;
   (b) about 2 to about 15 parts by weight of an acrylate monomer;
   (c) about 0.01 to about 3 parts by weight of a free radical initiator; and
   (d) about 72 to about 95 parts by weight of finely divided silver particles.

2. The conductive adhesive of claim 1 wherein the amount of said binder resin is about 4 to about 12 parts by weight.

3. The conductive adhesive of claim 1 wherein the amount of said acrylate monomer is from about 3 to about 13 parts by weight.

4. The conductive adhesive of claim 1 wherein the amount of said free radical initiator is from about 0.1 to about 1 parts by weight.

5. The conductive adhesive of claim 1 wherein the amount of finely divided silver particles is from about 75 to about 88 parts by weight.

6. The conductive adhesive of claim 1 which further comprises (e) about 0.1 to about 10 parts by weight of a rheological modifier.

7. The conductive adhesive of claim 1 wherein said binder resin is an acrylic resin.

8. The conductive adhesive of claim 1 wherein said binder resin is acrylated urethane resin.

9. The conductive adhesive of claim 1 wherein said acrylate monomer is a diacrylate monomer.

10. The conductive adhesive of claim 9 wherein said diacrylate monomer is tripropylene glycol diacrylate.

11. The conductive adhesive of claim 1 wherein said free radical initiator is 2,5-dimethyl-2,5bis(2-ethyl hexanoyl peroxy).

12. The conductive adhesive of claim 1 wherein said silver particles are silver flakes having an average particle diameter from about 0.1 to about 10 microns.

13. The conductive adhesive of claim 1 wherein the uncured conductive adhesive composition has a viscosity from about 10,000 to about 700,000 centiposes at 25° C. and a surface resistivity of less than about 1 ohm-cm.

14. A screen-printable surface mount conductive adhesive comprising:

(a) about 4 to about 12 parts by weight of a binder resin selected from the group consisting of acrylated urethane resin, acrylic resin, and mixtures thereof;
(b) about 3 to about 13 parts by weight of a diacrylate monomer;
(c) about 0.1 to about 1 parts by weight of 2,5-dimethyl-2,5-bis(2-ethyl hexanoyl peroxy); and
(d) about 75 to about 88 parts by weight of silver flakes having an average particle diameter from about 0.1 to about 10 microns; said the uncured conductive adhesive composition has a viscosity from about 10,000 to about 700,000 centiposes at 25° C. and a surface resistivity of less than about 1 ohm-cm.

15. The conductive adhesive of claim 14 which further comprises (e) about 0.1 to about 10 parts by weight of a rheological modifier.

16. An electrical component surface mounted onto a substrate by means of a surface mount conductive adhesive composition which before curing comprises:
(a) about 2 to about 15 parts by weight of a binder resin selected from the group consisting of acrylated urethane resin, acrylic resin, and mixtures thereof;
(b) about 2 to about 15 parts by weight of an acrylate monomer;
(c) about 0.01 to about 3 parts by weight of a free radical initiator; and
(d) about 72 to about 95 parts by weight of finely divided silver particles.

* * * * *